(12) United States Patent
Brunel et al.

(10) Patent No.: US 7,843,009 B2
(45) Date of Patent: Nov. 30, 2010

(54) ELECTROSTATIC DISCHARGE PROTECTION DEVICE FOR AN INTEGRATED CIRCUIT

(75) Inventors: John Brunel, Grenoble (FR); Nicolas Froidevaux, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 792 days.

(21) Appl. No.: 11/828,855

(22) Filed: Jul. 26, 2007

(65) Prior Publication Data
US 2008/0048208 A1    Feb. 28, 2008

(30) Foreign Application Priority Data
Jul. 27, 2006    (FR)    .................... 06 06879

(51) Int. Cl.
*H01L 21/00*    (2006.01)
(52) U.S. Cl. .................. 257/355; 257/357; 257/361; 257/E29.217; 257/E29.225; 257/E29.337; 438/133; 438/135; 438/137; 438/140; 438/416
(58) Field of Classification Search ......... 257/109–162, 257/355–365, E29.012, 217–225, 337; 438/133–140, 438/270, 271, 416
See application file for complete search history.

(56) References Cited

U.S. PATENT DOCUMENTS

| | | | | |
|---|---|---|---|---|
| 5,148,250 | A * | 9/1992 | Winnerl et al. | 257/361 |
| 5,449,939 | A | 9/1995 | Horiguchi et al. | 257/360 |
| 5,508,548 | A * | 4/1996 | Tailliet | 257/360 |
| 5,973,901 | A * | 10/1999 | Narita et al. | 361/111 |
| 6,218,881 | B1 | 4/2001 | Hiraga | 327/310 |
| 6,258,634 | B1 * | 7/2001 | Wang et al. | 438/133 |
| 6,455,898 | B1 | 9/2002 | Liu et al. | 257/360 |
| 6,458,632 | B1 * | 10/2002 | Song et al. | 438/133 |
| 6,639,284 | B1 * | 10/2003 | Chatterjee et al. | 257/355 |
| 6,844,595 | B2 * | 1/2005 | Chen | 257/355 |
| 6,864,537 | B1 * | 3/2005 | Mallikarjunaswamy | 257/355 |
| 7,109,533 | B2 * | 9/2006 | Kodama | 257/173 |
| 7,327,541 | B1 * | 2/2008 | Wang et al. | 361/56 |
| 7,479,414 | B2 * | 1/2009 | Salcedo et al. | 438/133 |
| 7,566,914 | B2 * | 7/2009 | Salcedo et al. | 257/127 |
| 7,595,537 | B2 * | 9/2009 | Kodama et al. | 257/409 |
| 2002/0074604 | A1 * | 6/2002 | Wang et al. | 257/355 |
| 2002/0149059 | A1 | 10/2002 | Ker et al. | 257/355 |
| 2007/0228476 | A1 * | 10/2007 | Okushima | 257/355 |
| 2007/0284665 | A1 * | 12/2007 | Nagai | 257/357 |
| 2009/0045457 | A1 * | 2/2009 | Bobde | 257/328 |
| 2009/0108289 | A1 * | 4/2009 | Abou-Khalil et al. | 257/173 |

FOREIGN PATENT DOCUMENTS

EP    1432035    6/2004

* cited by examiner

*Primary Examiner*—Michael S Lebentritt
(74) *Attorney, Agent, or Firm*—Lisa K. Jorgenson; Robert Iannucci; Seed IP law Group PLLC

(57) ABSTRACT

An integrated circuit is made of a semiconductor material and comprises an input and/or terminal connected to an output transistor forming a parasitic element capable of triggering itself under the effect of an electrostatic discharge applied to the terminal. The integrated circuit comprises a protection device formed so as to be biased at the same time as the parasitic element under the effect of an electrostatic discharge, and more than the parasitic element to evacuate a discharge current as a priority.

25 Claims, 4 Drawing Sheets

ELECTROSTATIC DISCHARGE PROTECTION DEVICE FOR AN INTEGRATED CIRCUIT

BACKGROUND OF THE INVENTION

1. Field of the Invention

The present invention relates to integrated circuits and more particularly to the protection of integrated circuits against electrostatic discharge (ESD—ElectroStatic Discharge).

One embodiment of the present invention applies mainly, but not exclusively, to CMOS-type (Complementary Metal-Oxide Semiconductor) integrated circuit technologies.

2. Description of the Related Art

One of the major problems of the reliability of integrated circuits relates to faults due to electrostatic discharge (ESD). This type of fault represents a critical problem in modern technologies as a result of the increasing miniaturization of integrated circuits. Indeed, reducing the dimensions of integrated circuits and therefore the distances between the elements increases the predominance of parasitic elements that can trigger themselves more rapidly and at voltages that tend towards the nominal operating voltage.

When an electrostatic discharge occurs on a contact pad of an integrated circuit, a high positive or negative voltage of several thousands of Volts compared to the ground can appear on the contact pad.

FIG. 1 represents a contact pad connected to an electric circuit forming an output or input/output port (buffer) of a CMOS-type integrated circuit. The port comprises a P-channel MOS transistor MP1 and an N-channel MOS transistor MN1 the gate of which is controlled by a control signal Cntl. The source of the transistor MP1 is connected to a supply terminal Vdd, and the drain of this transistor is connected to the drain of the transistor MN1 and to an output terminal Pad that must be protected of the output port. The source of the transistor MN1 is grounded.

FIG. 2 represents in a cross-section the transistor MN1 formed in a substrate of a P-doped semiconductor material 1 of an integrated circuit IC. The transistor MN1 comprises two N+-doped regions 5, 11 forming the drain and the source of the transistor, and a polysilicon gate 8 formed on the substrate between the regions 5 and 11. The output port comprises a contact pad 6 formed on the region 5 to connect the output of the output port to an output terminal Pad. The output port comprises a control terminal Cntl connected to a contact pad 9 formed on the gate 8. A ground connection contact pad 12 is formed on the region 11. The integrated circuit also comprises two P+-doped regions 3, 13, formed in the substrate 1 on either side of the regions 5, 11. Contact pads 4, 14 are formed on the regions 3, 13 to connect the integrated circuit to the ground.

The doped regions 5 and 11 form with the substrate a parasitic bipolar transistor T1 of npn type. The region 5 forms with the substrate a collector—base junction of the transistor T1, and the region 11 forms with the substrate an emitter—base junction of the transistor T1. The base of the transistor T1 is linked to the region 13 through the substrate 1 having a resistance Rsub.

FIG. 3 represents the evolution of the collector—base current of the transistor T1 according to the voltage applied to the terminal Pad, when a positive electrostatic discharge is applied to the connection terminal Pad. The voltage applied to the terminal Pad increases to reach a trigger threshold voltage Vtr. While the voltage increases, the current also increases to reach approximately 1 mA. As soon as the voltage exceeds the trigger voltage Vtr at a point DB, the voltage drops to a minimum voltage Vh, while the current continues to increase. From the point DB, the diode D1 at the drain—substrate junction of the transistor MN1 avalanches. When the minimum voltage Vh is reached, the parasitic transistor T1 is triggered. The result is that the voltage increases again while the current continues to increase more rapidly. From a point F, the voltage drops revealing that the transistor T1 is avalanching.

To limit the appearance or the destructive effects of these discharges, a protection device of the input/output or output ports is integrated into the semiconductor material of the integrated circuit.

Such a protection device is represented in FIG. 4. This device comprises a diode D2 having a minimum resistivity, connected between the drain and the source of the transistor MP1, and a centralized protection circuit ESD1 connected between the supply terminals Vdd and Gnd. In the event that an electrostatic discharge appears on the terminal Pad, the discharge current follows a discharge path DP towards the ground, passing through the diode D2 and the circuit ESD1. For this purpose, the circuit ESD1 is designed to react to a voltage drop more rapidly than the components of the port. It will be understood that the circuit ESD1 must be designed to absorb the discharge current.

In certain applications, it may be impossible to connect a diode between the drain and the source of the transistor MP1. This is the case for example when a bus is shared by several integrated circuits, and when one of the integrated circuits must be switched off for reasons of power consumption, without disturbing the communications on the bus.

A classic protection solution shown in FIG. 5 involves connecting a protection circuit ESD2 between the drain and the source of the transistor MN1. Two essential notions are then to be considered. The first notion is the efficiency of the protection, i.e., the capacity of the protection circuit ESD2 to trigger itself before the parasitic elements of the output port, failing which the output port might be damaged. Indeed, in an open-drain configuration, it can generally be observed that the protection circuit ESD2 competes with the parasitic bipolar transistor T1. The second notion is the robustness of the protection, i.e., the capacity of the protection circuit to absorb the discharge without being damaged.

Concerning the efficiency of the protection, it is possible to improve the trigger characteristics of the protection. This improvement generally leads to increasing the trigger threshold voltage of the parasitic transistor. However, this improvement can affect the robustness of the protection circuit and deteriorate the performances of the output port.

Generally speaking, the spurious phenomena are not modeled, or well known. These phenomena vary particularly according to the manufacturing chain. The result is that nothing guarantees that a protection solution is always efficient if a manufacturing or manufacturing chain parameter is changed. In addition, the increasing miniaturization of integrated circuits tends to increase the efficiency of the parasitic bipolar transistor, to the detriment of the efficiency of the parallel protection circuit. The solutions currently implemented therefore generally have a high cost in terms of overall dimensions, and of influence on the entire architecture of the integrated circuit. These solutions also limit the reduction of the supply voltage of the output port and thus of the thickness of the oxide layers, or require the addition of cascode-arranged transistors to limit the efficiency of the parasitic transistor.

It must be added that a protection can become totally inefficient as a result of the fact that the stress caused by the discharge tends to render the gate of the transistor MN1 floating and therefore to totally change the behavior of the parasitic transistor.

BRIEF SUMMARY

One embodiment of the present invention provides a protection device that does not have the limitations described above.

One embodiment of the present invention provides a protection circuit using a junction of the parasitic transistor as a detection and trigger element, and to channel the discharge current in a protection circuit as a priority, so as to prevent the port from being damaged. In the case of an output port, the detection element consists more precisely of the pn junction of the parasitic transistor connected to the output terminal.

Thus, there is no longer any competition, or limited competition, between the triggering of the parasitic element and the triggering of the protection device. The protection obtained is less sensitive to the manufacturing chain. In addition, the protection can easily be inserted into the architecture of the integrated circuit with a minimum cost in terms of overall dimensions.

More particularly, one embodiment of the present invention provides an integrated circuit made of a semiconductor material and comprising an input and/or output terminal connected to an output transistor forming a parasitic element capable of triggering itself under the effect of an electrostatic discharge applied to the terminal.

According to one embodiment of the present invention, the integrated circuit comprises a protection device formed so as to be biased at the same time as the parasitic element under the effect of an electrostatic discharge, and more than the parasitic element to evacuate a discharge current as a priority.

According to one embodiment of the present invention, the protection device is located further from a bias connection of the semiconductor material than the parasitic element, so as to be biased more than the parasitic element.

According to one embodiment of the present invention, the parasitic element and the protection device have a common junction produced by a first doped region formed in the semiconductor material and connected to the terminal.

According to one embodiment of the present invention, the output transistor is a MOS transistor the drain of which is formed by a first doped region connected to the terminal, and the parasitic element is a bipolar transistor.

According to one embodiment of the present invention, the output transistor has a channel length increased to disadvantage the avalanche breakdown likely to occur in the parasitic transistor.

According to one embodiment of the present invention, the protection device comprises a bipolar protection transistor connected to the terminal.

According to one embodiment of the present invention, the parasitic element and the protection transistor are biased by a same bias connection of the semiconductor material.

According to one embodiment of the present invention, the protection transistor is formed in the semiconductor material by a second doped region separated from the first region by an insulator.

According to one embodiment of the present invention, the insulator is formed in a trench.

According to one embodiment of the present invention, the resistance between the terminal and a terminal of the parasitic element is increased.

According to one embodiment of the present invention, the protection device comprises a thyristor connected to the terminal.

According to one embodiment of the present invention, the thyristor comprises a bipolar transistor of pnp type, and a bipolar transistor of npn type, the npn-type transistor comprising a collector linked to the terminal and a base located further from a bias connection of the semiconductor material than the parasitic element.

One embodiment of the present invention also relates to a method for protecting an integrated circuit against electrostatic discharges appearing on a terminal connected to an output transistor made of a semiconductor material and forming a parasitic element capable of triggering itself under the effect of an electrostatic discharge applied to the terminal.

According to one embodiment of the present invention, the method comprises steps of:

forming in the semiconductor material a protection device connected to the terminal, and following an electrostatic discharge, channeling an electrostatic discharge current in the protection device as a priority.

According to one embodiment of the present invention, the protection device is biased at the same time as and more than the parasitic element.

According to one embodiment of the present invention, the protection device is produced using a junction of the parasitic element, the junction being produced by a first doped region formed in the semiconductor material and connected to the terminal.

According to one embodiment of the present invention, the output transistor is a MOS transistor the drain of which is formed by a first doped region connected to the terminal, and the parasitic element is a bipolar transistor.

According to one embodiment of the present invention, the output transistor has a channel length increased to disadvantage the avalanche breakdown likely to occur in the parasitic transistor.

According to one embodiment of the present invention, the protection device comprises a bipolar protection transistor connected to the terminal.

According to one embodiment of the present invention, a terminal of the parasitic element and a terminal of the protection transistor are biased by a same bias connection of the semiconductor material.

According to one embodiment of the present invention, the protection transistor is formed in the semiconductor material by a second doped region separated from the first region by an insulator.

According to one embodiment of the present invention, the method comprises steps of increasing the resistance between the terminal and a terminal of the parasitic element.

According to one embodiment of the present invention, the method comprises a step of forming in the semiconductor material a thyristor connected to the terminal.

According to one embodiment of the present invention, the thyristor comprises a bipolar transistor of pnp type, and a bipolar transistor of npn type, the npn-type transistor comprising a collector linked to the terminal and a base located further from a bias connection of the semiconductor material than the parasitic element.

BRIEF DESCRIPTION OF THE SEVERAL VIEWS OF THE DRAWINGS

These and other features and advantages of the present invention shall be presented in greater detail in the following description of an embodiment of the present invention, given in relation with, but not limited to the following figures, in which.

DETAILED DESCRIPTION

Figure 1:
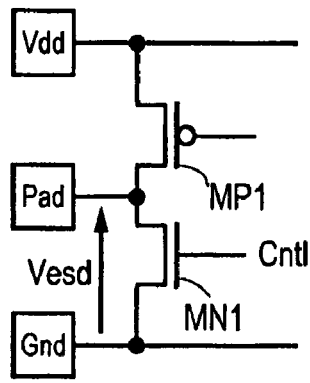
FIG. 1 already described represents an electric circuit of an output port.
Figure 2:
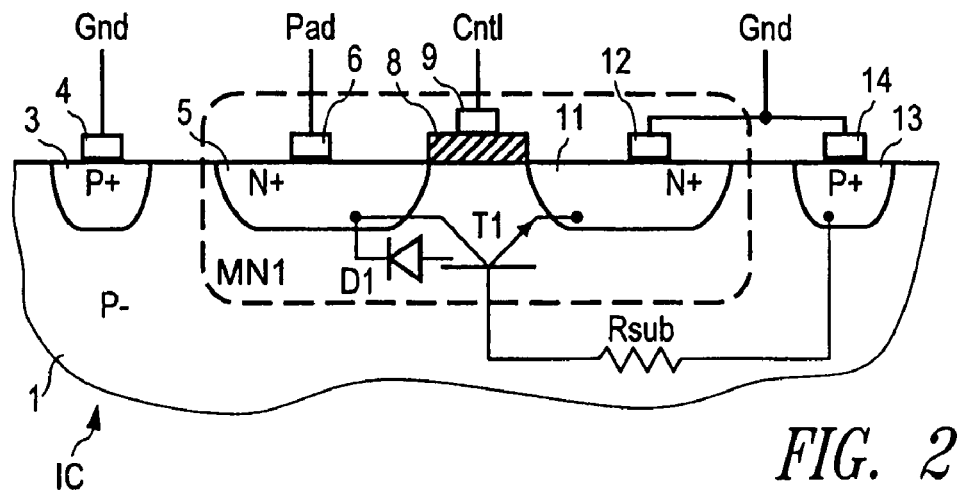
FIG. 2 already described is a partial cross-section view of an integrated circuit, having a transistor of the circuit represented in FIG. 1, FIG. 3 already described is a curve of variation according to the voltage and to the intensity of a discharge current in the transistor represented in FIG. 2, FIGS. 4 and 5 already described represent electric circuits of an output port equipped with protection devices according to prior art.
Figure 3:
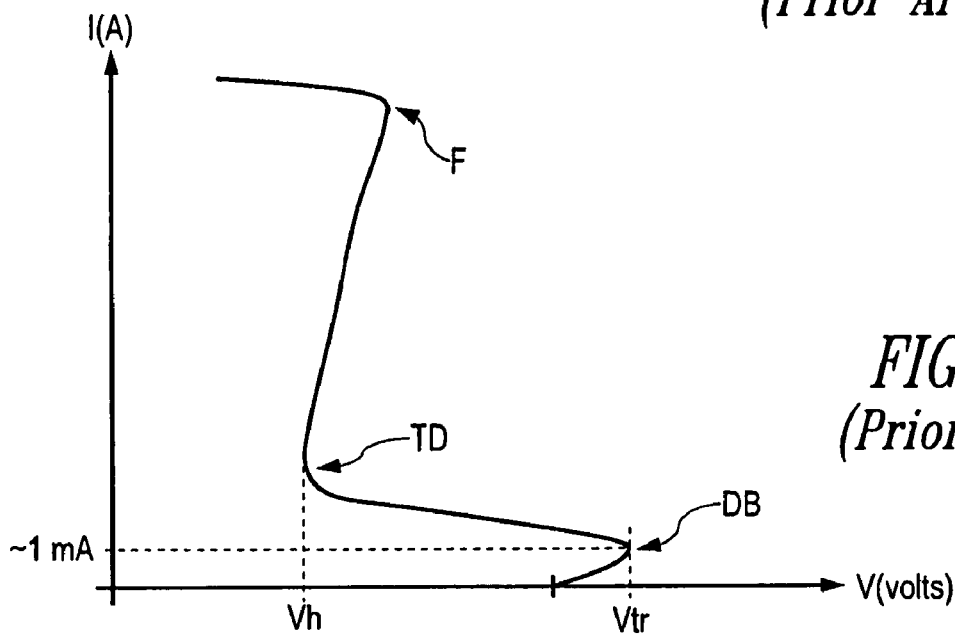
Figure 4:
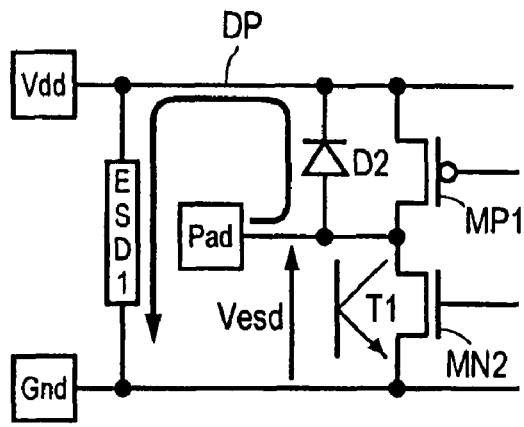
Figure 5:
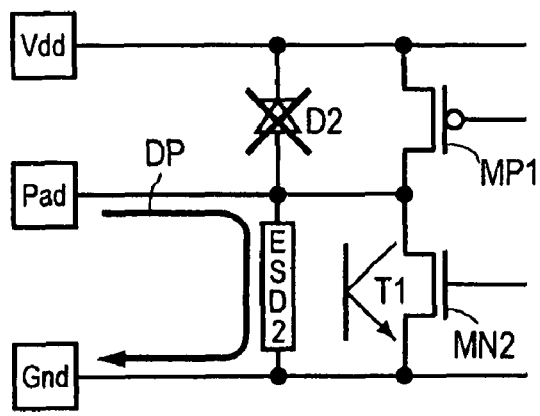
Figure 6:
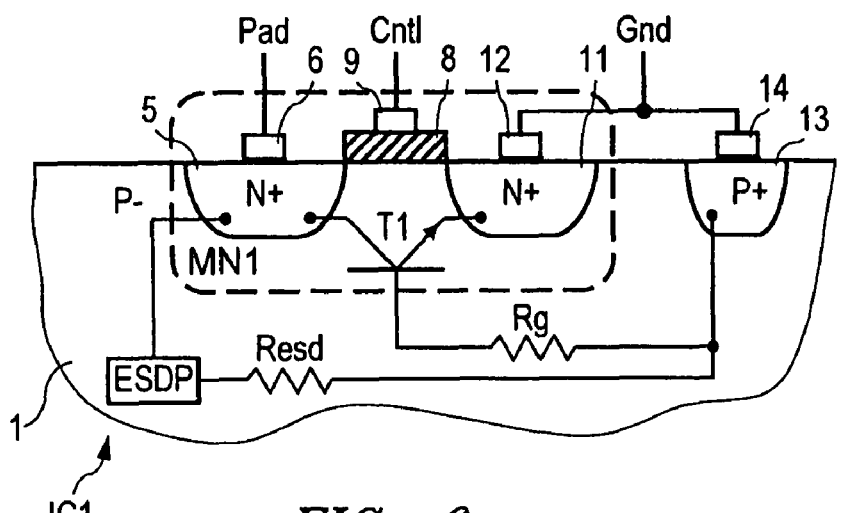
FIG. 6 is a partial cross-section schematic view of an integrated circuit comprising a port equipped with a protection device according to one embodiment of the present invention.

FIG. 6 represents an integrated circuit IC1 comprising a transistor MN1 belonging to an output port of the integrated circuit, like the one described with reference to FIG. 1. The transistor MN1 is formed in a substrate 1 of a P--doped semiconductor material. The transistor MN1 comprises two N+-doped regions 5, 11 forming the drain and the source of the transistor, and a polysilicon gate 8 formed on the substrate between the regions 5 and 11. The port comprises an output terminal Pad connected to a contact pad 6 formed on the region 5. The port comprises a control terminal Cntl connected to a contact pad 9 formed on the gate 8. A ground connection pad 12 is formed on the gate 8. The integrated circuit also comprises two P+-doped regions 3, 13, formed in the substrate 1 on either side of the regions 5, 11. Ground connection pads 4, 14 are formed on the regions 3, 13. The regions 5 and 11 form with the P-substrate a parasitic bipolar transistor T1 of npn type. The region 5 forms with the substrate the collector—base junction of the transistor T1, and the region 11 forms with the substrate the emitter—base junction of the transistor T1. The base of the transistor T1 is linked to the region 13 through a zone of the substrate 1 having a resistance Rg between the base of the transistor T1 and the region 13.

According to one embodiment of the present invention, the transistor is protected against the electrostatic discharges by a protection element ESDP formed in the substrate 1 so as to be biased at the same time as the parasitic transistor T1 by the electrostatic discharge current, and more than the parasitic transistor to evacuate more discharge current than the parasitic transistor.

For this purpose, the protection element is formed in the integrated circuit further from the ground connection region 13 than the base of the parasitic transistor T1. The zone of the substrate 1 between the protection element ESDP and the region 13 therefore has a resistance Resd greater than the resistance Rg between the base of the transistor T1 and the region 13.

Furthermore, the parasitic transistor T1 and the protection device ESDP have a common junction produced by the doped region 5.

Figure 7:
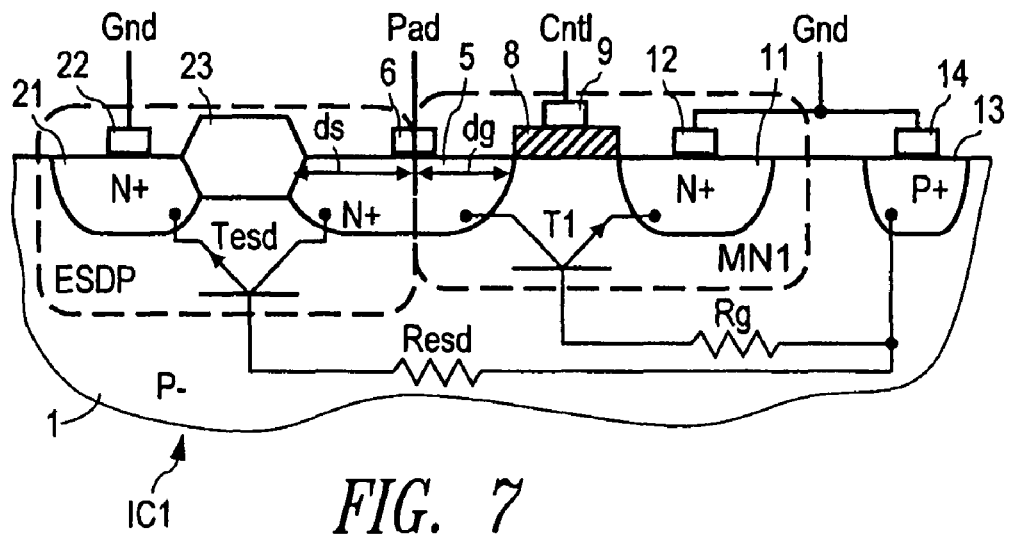
FIG. 7 is a partial cross-section view of an integrated circuit equipped with a first embodiment of a protection device according to one embodiment of the present invention.
Figure 8:
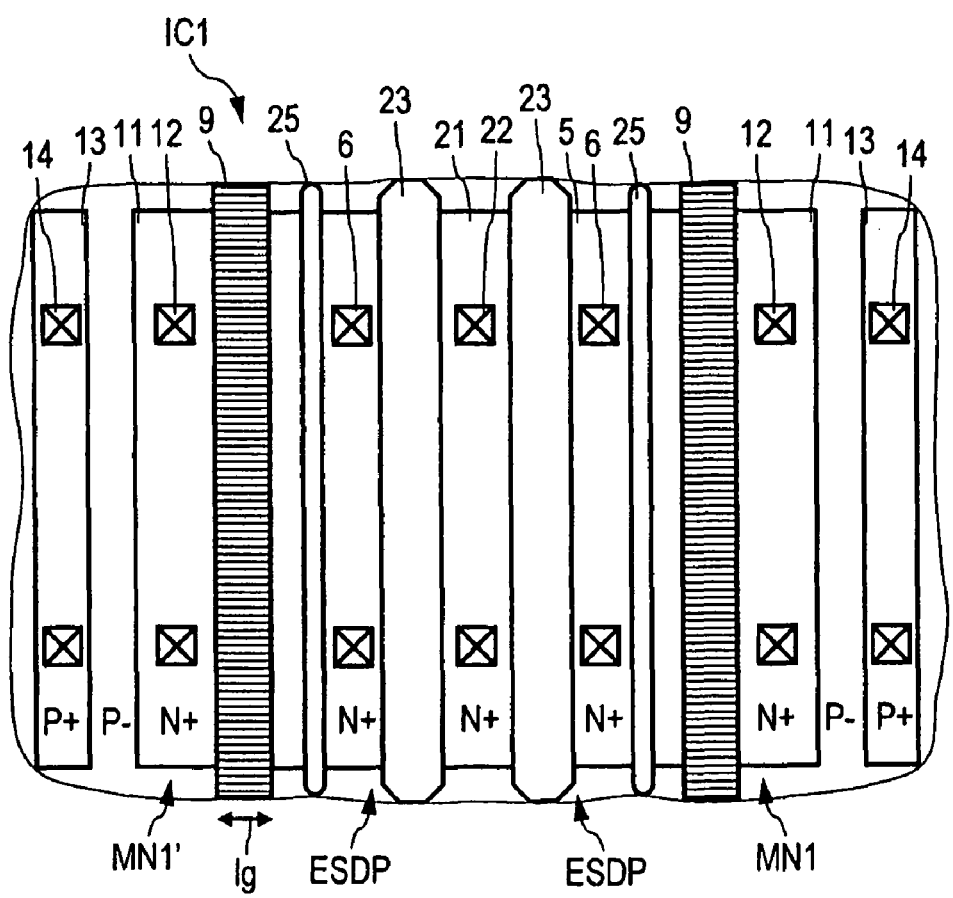
FIG. 8 is a partial view from above of the integrated circuit represented in FIG. 7.

FIGS. 7 and 8 represent one embodiment of a protection element ESDP according to one embodiment of the present invention, associated with the transistor MN1. The protection element comprises an npn bipolar transistor Tesd produced in so-called "Field MOS" technology. More particularly, the transistor Tesd is formed by the region 5, by an N+-doped region 21, and by an insulating layer 23 disposed between the regions 5 and 21. The insulating layer 23 is produced for example by a Shallow Trench Isolation STI or a field isolation by local oxidation of the substrate (field oxide). The emitter of the transistor Tesd is formed by the region 21 linked to the ground through a contact pad 22. The collector of the transistor Tesd is formed by the region 5 that is also the collector of the parasitic transistor T1 and the drain of the transistor MN1.

The protection transistor Tesd therefore shares with the parasitic element T1 the N+/P-junction formed by the region 5 in the substrate 1. As a result, when the diode formed by this junction avalanches due to the appearance of an electrostatic discharge on the terminal Pad, the two transistors Tesd and T1 trigger at the same time.

The base region of the transistor Tesd is further from the ground connection region 13 or from any other ground connection of the integrated circuit, than the base region of the parasitic transistor. The bias resistance Resd of the transistor Tesd is therefore greater than the bias resistance Rg of the transistor T1. The result is that the discharge current passing through the parasitic transistor T1 remains limited, as the major portion of the discharge current is channeled in the transistor Tesd. It is sufficient therefore to design the transistor Tesd according to the intensity or to the power of the electrostatic discharges that the integrated circuit is desired to be able to bear and evacuate.

In FIG. 8, the regions 5, 11, 13 and 21, the gate 9, and the insulating layer 23 have in a top view substantially elongated rectangular shapes.

As shown in FIG. 8, two protection transistors Tesd can be produced side by side to protect two ports formed symmetrically on either side of the two transistors Tesd. In this configuration, the base of the transistors Tesd is not located closer to another grounded P+region 13, than the base of a parasitic transistor T1. The condition on the bias of the transistors Tesd compared to the parasitic transistors is therefore met.

Furthermore, the length lg of the gate 9 (length of the channel of the transistor MN1) is preferably minimum to limit the surface occupied by the transistor MN1. However, the length lg can be increased to disadvantage the avalanche breakdown likely to occur in the transistor T1.

It shall be noted that the widths ds and dg of the region 5, on either side of the connection of the contact pad 6 to the terminal Pad, also influence the efficiency of the protection. The lower the width dg of the region 5 on the transistor MN1 side compared to the width ds of the region 5 on the transistor Tesd side is, the more efficient the protection provided by the transistor Tesd is insofar as the discharge current is channeled in the transistor Tesd more than in the parasitic transistor.

To further increase the efficiency of the protection, the resistance of the region 5 on the transistor MN1 (or T1) side can be increased by an N--doped well resistor of a large width and a low length, or by a low resistor 25 connected to the output terminal Pad. Thus, the value of the resistance of the connection of the transistor T1 collector to the terminal Pad is increased with respect to the resistance of the connection of the transistor Tesd collector to the terminal Pad.

Figure 9:
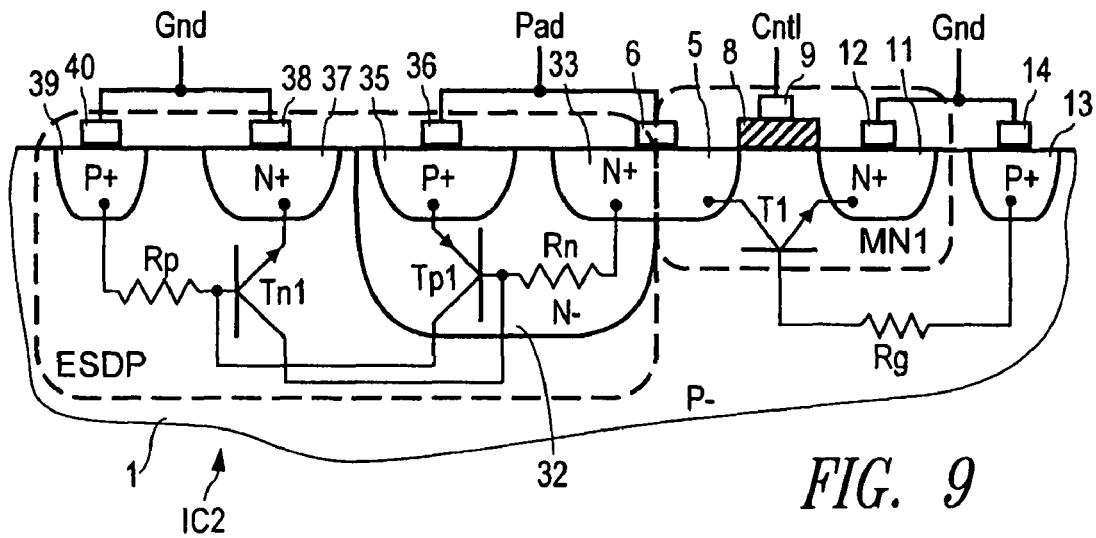
FIG. 9 is a partial cross-section view of an integrated circuit, equipped with a second embodiment of a protection circuit according to one embodiment of the present invention.
Figure 10:
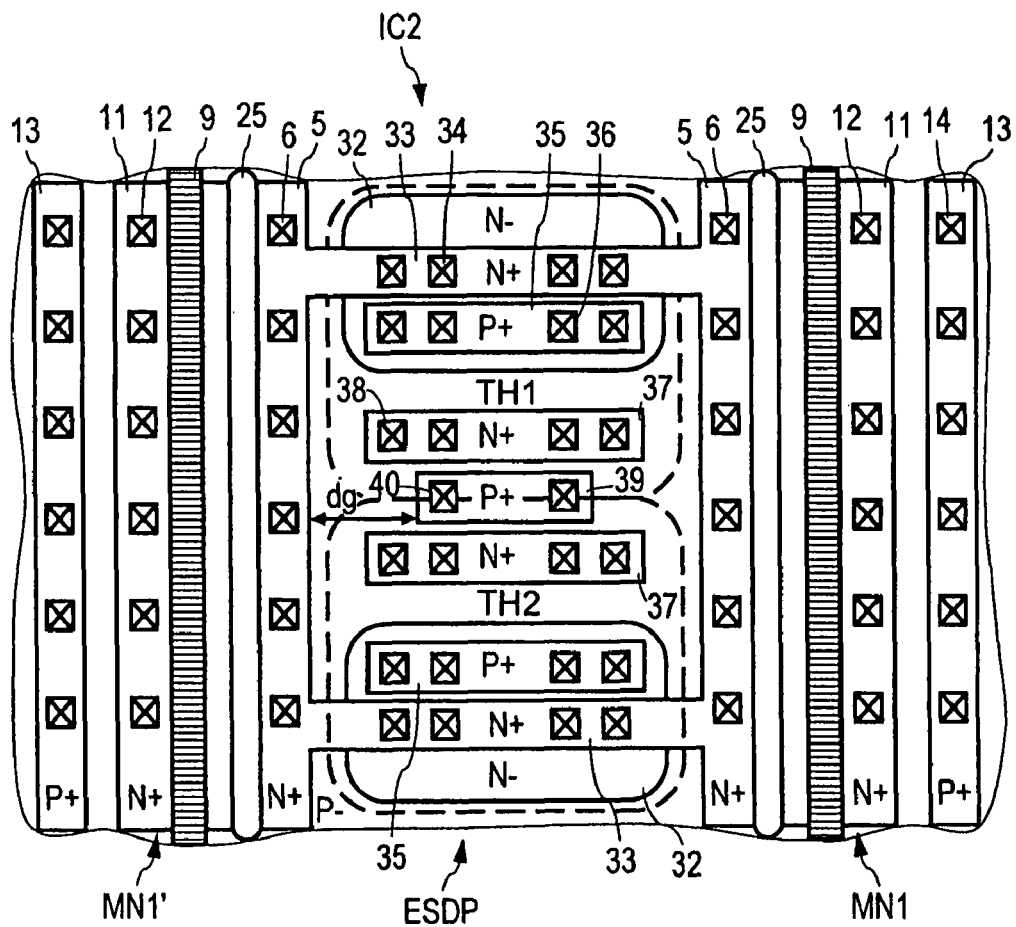
FIG. 10 is a partial view from above of the integrated circuit represented in FIG. 9.

FIGS. 9 and 10 represent an integrated circuit IC2 showing another embodiment of a protection element ESDP according to one embodiment of the present invention, associated with the transistor MN1. The protection element is a thyristor formed in a classic manner by two bipolar transistors Tp1 of pnp type and Tn1 of npn type. The base of the transistor Tp1 is connected to the collector of the transistor Tn1 and the base of the transistor tn1 is connected to the collector of the transistor tp1.

The transistor Tp1 is produced by two N+-and P+-doped regions 33, 35 formed in an N--doped well 32. The N+-doped region 33 is adjacent to the region 5 of the transistor MN1. The output terminal Pad is linked to the region 35 through a contact pad 36 also connected to the terminal Pad. The base of the transistor Tp1 is linked to the region 33 by the well 32 forming a resistance Rn. The emitter of the transistor Tp1 is formed by the region 35.

The transistor Tn1 is produced by two N+-and P+-doped regions 37, 39 grounded through contact pads 38, 40. The base of the transistor Tn1 is linked to the region 39 by the substrate 1 forming a resistance Rp. The emitter of the transistor Tn1 is formed by the region 37.

FIG. 10 represents a symmetrical architecture in which the active surface of the integrated circuit IC2 located between two transistors MN1, MN1' is occupied by thyristors TH1, TH2 of the protection device ESDP. The regions 5 of the transistors MN1, MN1' are linked to each other by the regions 33 of the thyristors TH1, TH2.

In this embodiment, the thyristor is biased at the same time as the parasitic transistor T1 under the effect of an electrostatic discharge, and more than the parasitic transistor to evacuate more discharge current than the parasitic transistor. For this purpose, the region 39 is situated at a distance dg from the region 5 or 33, greater than the distance between the regions 5 and 13 corresponding to the distance between the base of the transistor T1 and the P+ ground connection region 13. Thus, the bias resistance Rn linking the base of the transistor Tn1 to the ground is greater than the bias resistance Rg linking the base of the transistor T1 to the ground.

As in the first embodiment using a bipolar protection transistor, the length lg of the gate 9 can be increased to disadvantage the avalanche breakdown likely to occur in the parasitic transistor T1.

To further increase the efficiency of the protection, the resistance of the region 5 on the transistor MN1 side can be increased by an N--doped well resistance of a large width and a low length, or by a low resistance 25 connected to the output terminal Pad. Thus, the value of the resistance of the connection of the transistor T1 collector to the terminal Pad is increased with respect to the resistance of the connection of the transistor Tn1 collector to the terminal Pad.

Thyristors are known for their efficiency in dissipating electrical power. Their use as electrostatic discharge protection elements is therefore well suited. However, on the other hand, a thyristor occupies substantially more surface area on an integrated circuit than a simple bipolar transistor produced by the "Field MOS" technology.

It will be understood by those skilled in the art that various alternative embodiments and applications of the present invention are possible without deviating from the spirit and scope of the invention. In particular, the present invention does not necessarily apply to an output or input/output terminal. It is also applicable to an input terminal. In this case, a dummy N-channel MOS transistor is provided the drain of which is connected to the input terminal. Accordingly, the invention is not limited except as by the appended claims.

The invention claimed is:

1. An integrated circuit formed in a semiconductor material comprising:
   a protected terminal;
   a transistor connected to the protected terminal and forming a parasitic element capable of triggering itself under an effect of an electrostatic discharge applied to the protected terminal; and
   a protection device formed so as to be biased at the same time as the parasitic element under the effect of the electrostatic discharge, the protection device being positioned to channel an electrostatic discharge current more readily than the parasitic element.

2. The integrated circuit according to claim 1 further comprising a bias connection, wherein the protection device is located further from the bias connection of the semiconductor material than the parasitic element is from the bias connection, so as to be biased more than the parasitic element.

3. The integrated circuit according to claim 1 wherein the parasitic element and the protection device have a common junction produced by a doped region formed in the semiconductor material and connected to the protected terminal.

4. The integrated circuit according to claim 1 wherein the transistor is a MOS transistor having a drain formed by a doped region connected to the protected terminal, and the parasitic element is a bipolar transistor.

5. The integrated circuit according to claim 1 wherein the protection device comprises a bipolar protection transistor connected to the protected terminal.

6. The integrated circuit according to claim 5 wherein the parasitic element and the protection transistor are biased by a same bias connection of the semiconductor material.

7. The integrated circuit according to claim 5 wherein the transistor includes a first doped region and the protection transistor is formed in the semiconductor material and includes a second doped region separated from the first doped region by an insulator.

8. The integrated circuit according to claim 7 wherein the insulator is formed in a trench.

9. The integrated circuit according to claim 5 comprising a resistance inserted between the protected terminal and a terminal of the parasitic element.

10. The integrated circuit according to claim 1 wherein the protection device comprises a thyristor connected to the protected terminal.

11. The integrated circuit according to claim 10 wherein the thyristor comprises a pnp transistor, and an npn bipolar transistor, the npn transistor comprising a collector linked to the protected terminal and a base located further from a bias connection of the semiconductor material than the parasitic element is located from the bias connection.

12. A method comprising:
    forming an integrated circuit in a semiconductor material including an transistor connected to a protected terminal and a parasitic element capable of triggering itself under an effect of an electrostatic discharge applied to the protected terminal;
    forming in the semiconductor material a protection device connected to the protected terminal; and
    channeling an electrostatic discharge current through the protection device more than through the parasitic element.

13. The method according to claim 12 wherein the protection device is biased at the same time as the parasitic element with a stronger bias than the parasitic element.

14. The method according to claim 12 wherein the protection device is produced using a junction of the parasitic element, the junction being produced by a first doped region formed in the semiconductor material and connected to the protected terminal.

15. The method according to claim 12 wherein the output transistor is a MOS transistor having a drain formed by a first doped region connected to the protected terminal, and the parasitic element is a bipolar transistor.

16. The method according to claim 12 wherein the protection device comprises a bipolar protection transistor connected to the protected terminal.

17. The method according to claim 16 wherein a terminal of the parasitic element and a terminal of the protection transistor are biased by a same bias connection of the semiconductor material.

18. The method according to claim 16 wherein the protection transistor is formed in the semiconductor material by a second doped region separated from the first region by an insulator.

19. The method according to claim 16, comprising inserting a resistance between the protected terminal and a terminal of the parasitic element.

20. The method according to claim 12, comprising a step of forming in the semiconductor material a thyristor connected to the protected terminal.

21. The method according to claim 20 wherein the thyristor comprises a bipolar transistor of pnp type, and a bipolar transistor of npn type, the npn-type transistor comprising a collector linked to the protected terminal and a base located further from a bias connection of the semiconductor material than the parasitic element.

22. An integrated circuit formed in a semiconductor, the integrated circuit comprising:
   a transistor;
   a protected terminal connected to the transistor;
   a parasitic element connected to the protected terminal;
   a bias connection coupled to a control terminal of the parasitic element; and
   an electrostatic discharge protection device connected to the protected terminal and located in the semiconductor further from the bias connection than the parasitic element is from the bias connection.

23. The integrated circuit of claim 22 wherein the protection device is a bipolar transistor.

24. The integrated circuit of claim 23 wherein the transistor is an MOS transistor and the parasitic element is a bipolar transistor.

25. The integrated circuit of claim 22 wherein the protection device is a thyristor.

* * * * *